US009171534B2

(12) United States Patent
Tronchin et al.

(10) Patent No.: US 9,171,534 B2
(45) Date of Patent: Oct. 27, 2015

(54) METHOD FOR ARTIFICIALLY REPRODUCING AN OUTPUT SIGNAL OF A NON-LINEAR TIME INVARIANT SYSTEM

(75) Inventors: Lamberto Tronchin, Bologna (IT); Andrea Venturi, Bologna (IT)

(73) Assignee: Alma Mater Studiorum—Universita' di Bologna (IT)

( * ) Notice: Subject to any disclaimer, the term of this patent is extended or adjusted under 35 U.S.C. 154(b) by 675 days.

(21) Appl. No.: 13/518,465

(22) PCT Filed: Dec. 23, 2010

(86) PCT No.: PCT/IB2010/056059

§ 371 (c)(1),
(2), (4) Date: Sep. 12, 2012

(87) PCT Pub. No.: WO2011/077408

PCT Pub. Date: Jun. 30, 2011

(65) Prior Publication Data

US 2012/0328128 A1 Dec. 27, 2012

(30) Foreign Application Priority Data

Dec. 23, 2009 (IT) ............................. MO2009A0313

(51) Int. Cl.
*H03G 3/00* (2006.01)
*G10H 3/18* (2006.01)
*G10H 1/16* (2006.01)

(52) U.S. Cl.
CPC . *G10H 3/187* (2013.01); *G10H 1/16* (2013.01)

(58) Field of Classification Search
CPC combination set(s) only.
See application file for complete search history.

(56) References Cited

U.S. PATENT DOCUMENTS 5,802,182 A * 9/1998 Pritchard ........................ 381/61

OTHER PUBLICATIONS

Emulation of Not-Linear, time variant devices by the convolution technique; Authors: Angelo Farina, Enrico Armelloni; Date Nov. 3-5, 2005; pp. 1-7.*
Digital equalization of automotive sound systems emplying spectral smoothed FIR Filters; Authors: Marco Binelli, Angelo Farina; Date: Oct. 2-5, 2008, pp. 1-9.*
Modeling of nonlinear audio systems using swept sine signals: application to audio effects; Authors: Antonin Novak, Laurent Simon, Pierrick Lotton, Frantisek Kadlec; Date: Sep. 1-4, 2009; pp. 1-6.*
(Continued)

*Primary Examiner* — Duc Nguyen
*Assistant Examiner* — Assad Mohammed
(74) *Attorney, Agent, or Firm* — Laubscher, Spendlove & Laubscher, P.C.

(57) ABSTRACT

A method for artificially reproducing an output signal of a non-linear time invariant system includes the steps of inserting an input signal of exponential sine sweep type in the non-linear time invariant system, acquiring an output signal of the non-linear time invariant system corresponding to the input signal, obtaining a mathematical function that characterizes the non-linear time invariant system on the basis of the output signal and applying the mathematical function to a further signal to obtain a still further signal which reproduces the output signal that would be obtained from the non-linear time invariant system if it were driven by the further signal.

6 Claims, 8 Drawing Sheets

(56) References Cited

OTHER PUBLICATIONS

Farina, Angelo, et al, "Emulation of Not-Linear, Time-Variant Devices by the Convolution Technique,"AES Italian Section—Annual Meeting, Nov. 3-5, 2005, pp. 1-7, Paper 05014, Italy. (Retrieved from the Internet: www.ramsete.com/Public/Papers/211-AesItalia2005.pdf; Jul. 5, 2012).

Farina, Angelo, "Impulse Response Measurements," 23rd Nordic Sound Symposium: Training and Information Seminar for Audio People, Sep. 27-30, 2007, pp. 1-31, Bolkesjo Tourist Hotel. (Retrieved from the Internet: www.angelofarina.it/Public/NordicSound-2007/NordicSound-Farina_paper.doc; Jul. 5, 2012).

* cited by examiner

METHOD FOR ARTIFICIALLY REPRODUCING AN OUTPUT SIGNAL OF A NON-LINEAR TIME INVARIANT SYSTEM

This application is a §371 National Stage of PCT International Application No. PCT/IB2010/056059 filed Dec. 23, 2010. PCT/IB2010/056059 claims priority to IT Application No. MO2009A000313 filed Dec. 23, 2009. The entire contents of these applications are incorporated herein by reference.

The invention relates to a method for reproducing an output signal of a non-linear time invariant system, in particular a method used for example for artificially reproducing a particular acoustic effect going close to the real one. Such acoustic effect can be, for example, the sound that can produce a sound chest of a particular musical instrument when it is played or a sound amplified by a non-linear amplifier such as a tube amplifier.

Each of the aforesaid systems, namely a sound chest of a musical instrument or a tube amplifier, or the sound produced by combinations of the aforesaid systems, is a non-linear system. As a result, each of the aforesaid systems modifies the input signals sent, so the corresponding output signals are distorted with respect the respective input signals. This means that the output signal has different frequency components compared to the input signal. In particular, the output signal may have a plurality of harmonics at frequencies that are different the one from each other and different from the frequency/frequencies of the input signal, even if the input signal has only one component at fundamental frequency.

The harmonic distortions introduced by each system characterize the sound generated by each system, making the sound unique and recognizable among others. This means that each sound generated by a system differs from the sound generated by another system because of its harmonic content. It follows that a system is distinguished from another one because of the harmonic distortions it introduces in the sound produced by the system.

A distorting system can be an overdrive device that makes possible, by suitable amplifying means, to amplify an audio signal until the amplifier is in a saturation condition, generating an overloaded and distorted output signal.

Another distorting system can be a device that modifies the wave form of an audio signal sent to the input thereof, for example by subjecting it to a squaring process. It follows that the output audio signal is distorted compared to the input.

The overdrive devices and distorting devices used in the musical field, for example associated to an electrical guitar, intentionally reproduce distorting signals, by introducing in the spectrum of an output audio signal from the device, additional harmonics which are not present in the corresponding input audio signal from the overdrive device and/or the distorting device.

Methods for artificially reproducing in a faithful manner an output signal of a non-linear time invariant system, such as for example the sound of a particular specimen musical instrument, are not known.

An object of the invention is to give a method for artificially reproducing an output signal of a non-linear time invariant system, such as for example the sound of a particular specimen instrument.

Another object is to obtain a method for artificially reproducing, economically, the output signal of a non-linear time invariant system, such as a tube amplifier that is typically very expensive.

According to the invention there is provided a method as defined in claim 1.

Owing to the invention, it is possible to reproduce by means of a data processing device the output signal from a non-linear system, in particular an audio signal produced by a particular musical instrument.

The invention can be understood and implemented better with reference to the attached drawings that illustrate some embodiments thereof by way of non-limiting example, in which.

Figure 12:
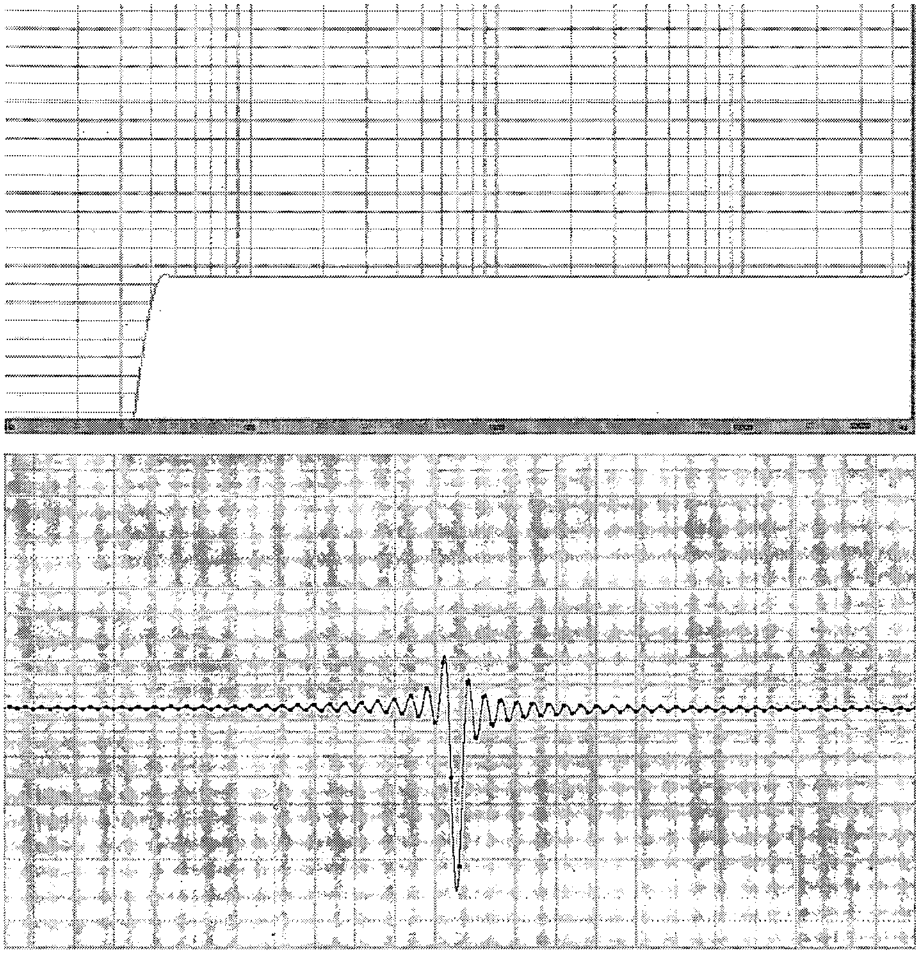
FIG. 12 shows how the problems relating to the phase deteriorates a Dirac Delta signal.

With reference to FIG. 12, a non-linear time invariant system 1 is schematically shown with a rectangle, the system having an input signal and an output signal, that are for example audio signals, expressed, in the time domain, as x(t) and y(t) respectively.

For the linear system the following relation applies:

$$y(t)=h(t)\otimes x(t)=\int_{-\infty}^{+\infty}h(\tau)x(t-\tau)d\tau \qquad (1)$$

that defines the so called convolution between the input signal x(t) and the impulse response h(t) in the time domain, in which the symbol ⊗ identifies the convolution operator.

A non-linear time invariant system with memory, such as for example the sound chest of a musical instrument, for example that of a violin, can be modeled by Volterra series:

$$\begin{aligned} y(t) &= h_0 + \sum_{n=1}^{+\infty}\frac{1}{n!}\int_{-\infty}^{+\infty}\cdots\int_{-\infty}^{+\infty}h_n(\tau_1,\tau_2,\ldots,\tau_n)x(t-\tau_1) \\ &\quad x(t-\tau_2)\ldots x(t-\tau_n)d\tau_1 d\tau_2\ldots d\tau_n \\ &= h_0 + \frac{1}{1!}\int_{-\infty}^{+\infty}h_1(\tau_1)x(t-\tau_1)d\tau_1 + \end{aligned} \qquad (2)$$

-continued $$\frac{1}{2!}\int_{-\infty}^{+\infty}\int_{-\infty}^{+\infty}h_2(\tau_1,\tau_2)x(t-\tau_1)x(t-\tau_2)d\tau_1 d\tau_2 + \frac{1}{3!}\int_{-\infty}^{+\infty}\int_{-\infty}^{+\infty}\int_{-\infty}^{+\infty}h_3(\tau_1,\tau_2,\tau_3)x(t-\tau_1)x(t-\tau_2)x(t-\tau_3)d\tau_1 d\tau_2 d\tau_3 + \dots$$

where the terms $h_n(\tau_1, \tau_2, \dots, \tau_n)$ are the so called n-th order kernels of the Volterra series expansion.

By knowing the kernels value it is thus possible to obtain the value of the output signal y(t) for a given input signal x(t).

Figure 1:
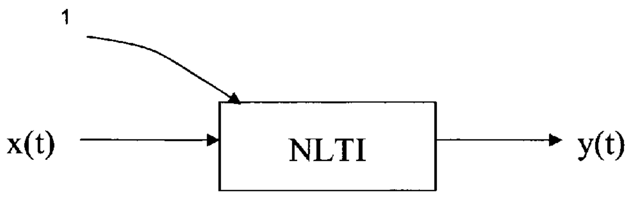
FIG. 1 is a scheme of a non-linear time invariant system.
Figure 2:
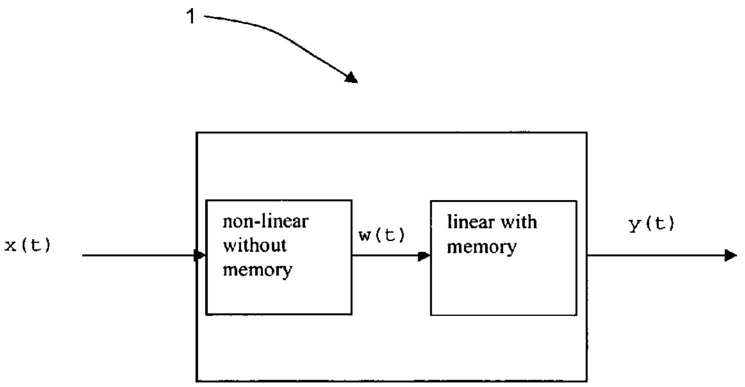
FIG. 2 is a scheme showing a model (Hammerstein model) that represents the non-linear time invariant system in FIG. 1.

Assuming that the memory effects reside in the linear part of the system and that the nonlinearities of the system are purely algebraic, the non-linear system 1 can be simplified in the series of two systems: a non-linear time invariant system without memory and a linear time invariant system with memory. The output signal y(t) of such model (Hammerstein model) applies and is reported schematically in FIG. 2:

$$\begin{aligned} y(t) &= \int_{-\infty}^{+\infty} h(\tau)w(t-\tau)\,d\tau \\ &= \int_{-\infty}^{+\infty} h(\tau)\left(a_0 + \sum_{n=1}^{+\infty} a_n[x(t-\tau)]^n\right)d\tau \\ &= \int_{-\infty}^{+\infty} a_0 h(\tau)d\tau + \sum_{n=1}^{+\infty}\int_{-\infty}^{+\infty} a_n h(\tau)[x(t-\tau)]^n\,d\tau \\ &= h_0 + h_1(t)\otimes x(t) + h_2(t)\otimes[x(t)]^2 + h_3(t)\otimes[x(t)]^3 + \dots \end{aligned} \tag{3}$$

wherein w(t) is the output signal of the non-linear purely algebraic part and therefore it can be substituted with the expression $a_0+\Sigma_{n=1}^{+\infty}a_n[x(t)]^n$.

The Hammerstein model equals a particular case of the Volterra series expansion, called Volterra diagonal model, in which for each kernel only the values when $t_1=t_2=\dots=t_n$ differ from zero.

The more the Volterra diagonal model follows the real system the more the reproduction of the output signal from the non-linear system will be faithful, for example the reproduction of the sound produced by a specific musical instrument.

In order to characterize the non-linear time invariant system 1 it is necessary to obtain the kernel values of the Volterra series expansion, thus to define the non-linear features of the non-linear time invariant system 1. In other words obtaining the kernel values of the Volterra series expansion it is possible to get the mathematical function that characterizes the system. In order to obtain the kernel values the same procedure must be followed for calculating the impulse response with the measurement technique based on the exponential sine sweep of a linear time invariant system, in the way will be better explained further on.

The method for reproducing an output signal from the non-linear time invariant system 1 uses a measurement technique of the impulse response of a linear system that uses as input signal x(t) a signal of the sine sweep type, i.e. a sine signal with frequency that varies from a starting frequency $f_0$ to a final frequency $f_1$ in T seconds.

The input signal x(t) thus is:

$$x(t)=\sin(2\pi g(t)) \tag{4}$$

in which g(t) is a function defined as the integral of a function of the exponential type f(t) that has the following formula:

$$f(t) = e^{\gamma_0+\frac{\gamma_1-\gamma_0}{T}t} = e^{\gamma_0}e^{(\gamma_1-\gamma_0)\frac{t}{T}} \tag{5}$$

Assuming that at t=0 the starting frequency $f_0$ is:

$$f(0)=e^{\gamma_0}=f_0$$

and that at t=T the frequency $f_1$ is:

$$f(T)=e^{\gamma_0}e^{(\gamma_1-\gamma_0)}=f_0e^{(\gamma_1-\gamma_0)}=f$$

we obtain:

$$e^{(\gamma_1-\gamma_0)} = \frac{f_1}{f_0} = e^{ln\left(\frac{f_1}{f_0}\right)} \Rightarrow \gamma_1-\gamma_0 = \ln\left(\frac{f_1}{f_0}\right)$$

Replacing in the equation (5) gives that f(t) is:

$$f(t) = f_0 e^{\frac{t}{T}ln\left(\frac{f_1}{f_0}\right)} \tag{6}$$

Integrating f(t) gives the value of g(t), i.e.:

$$g(t) = \frac{f_0 T}{\ln\left(\frac{f_1}{f_0}\right)}e^{\frac{t}{T}ln\left(\frac{f_1}{f_0}\right)} + \theta \tag{7}$$

Setting:

$$\theta = -\frac{f_0 T}{\ln\left(\frac{f_1}{f_0}\right)}$$

$$f_0 = \frac{\omega_0}{2\pi}$$

$$f_1 = \frac{\omega_1}{2\pi}$$

the value of the input signal x(t), which is the equation defining the sine sweep, is:

$$x(t) = \sin\left(\frac{\omega_0 T}{\ln\left(\frac{\omega_1}{\omega_0}\right)}\left(e^{\frac{t}{T}ln\left(\frac{\omega_1}{\omega_0}\right)} - 1\right)\right) \tag{8}$$

Figure 3:
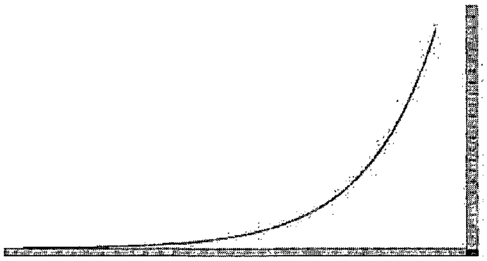
FIG. 3 is the spectrogram in linear scale of an input signal of the non-linear time invariant system, when such input signal is a signal of the exponential sine sweep type.
Figure 4:
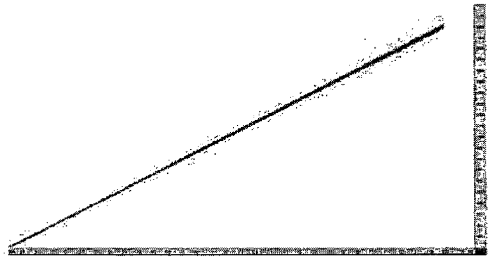
FIG. 4 is the spectrogram like the one in FIG. 3 using a logarithmic scale.

In which the value of the starting phase θ has been chosen so that x(0)=0;

FIGS. 3 and 4 show, respectively, the spectrograms of the input signal x(t) of the non-linear time invariant system 1 in linear and in logarithmic scale, when the input signal x(t) is a signal of the sine sweep type.

Figure 5:
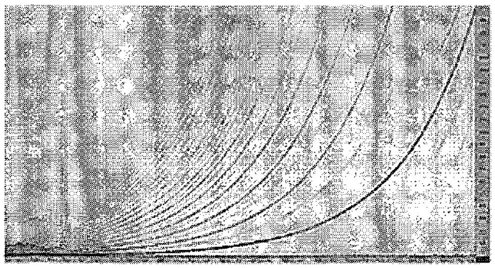
FIG. 5 is the spectrogram in linear scale of an output signal of a non-linear time invariant system when the input signal is a signal of the exponential sine sweep type.
Figure 6:
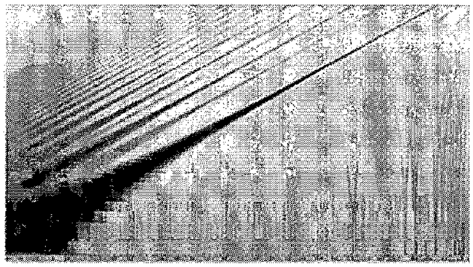
FIG. 6 is the spectrogram like the one in FIG. 5 using a logarithmic scale.

FIGS. 5 and 6 show, respectively, in linear and logarithmic scale the spectrograms of the output signal y(t) of the non-linear time invariant system 1 when the input signal x(t) of the non-linear time invariant system 1 is a signal of the exponential sine sweep ss(t) type.

A well known feature of the signal of the linear sine sweep type is that its reverse reproduction is also its "inverse":

defining as "inverse" of the waveform x(t) that waveform $\overline{x(t)}$ for which is valid $x(t)\otimes\overline{x(t)}=\delta(t-t_0)$, in which $t_0$ is a delay. In the case of exponential sine sweep as the spectrum is pink, i.e. with a fall of 3 dB every octave, once the reverse reproduction has been obtained it is necessary to equalize it in order to obtain a spectrum with a rise of 3 dB for every octave: this is the "inverse" signal of the exponential sine sweep.

Convolving a ss(t) of length T with its equalized reverse reproduction there is thus obtained a time-delayed Dirac Delta, i.e.:

$$ss(t)\otimes ss(T-t)=ss(t)\otimes ss(t)\cong\delta(t-T)$$

$$0\le t\le T \tag{9}$$

The approximation is due to the fact that each sine sweep signal covers only a part of the frequency spectrum, that, for example in the acoustic field, is the part comprised between a starting frequency $f_0$=20 Hz and a final frequency $f_1$=20 kHz that are the ends of the human audible frequency range.

Figure 7:
FIG. 7 is the spectrogram of the inverse of a signal of the exponential sine sweep type in logarithmic scale.
Figure 8:
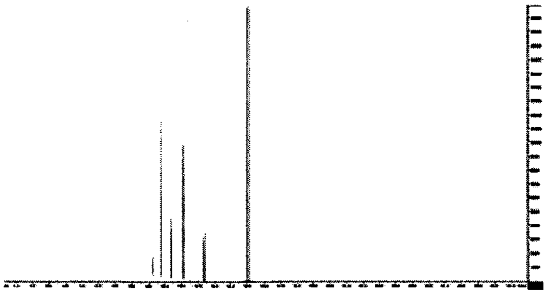
FIG. 8 is the spectrogram of the inverse convolution of a non-linear time invariant system subjected to an exponential sine sweep.

FIG. 7 shows the spectrogram of the inverse of a signal of the sine sweep type, whilst FIG. 8 shows the spectrogram of a signal representing the inverse convolution of the output of a non-linear time invariant system subjected to an exponential sine sweep. This latter graph is composed by a plurality of lines mutually parallel, which in a time-frequency plot are parallel with the frequency axis.

It is possible to find a relationship between these vertical lines and the kernels of the Volterra diagonal model.

Figure 10:
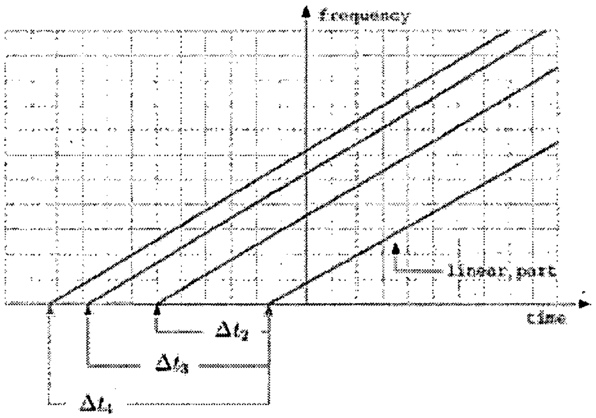
FIG. 10 is the reproduction of a spectrogram of an output signal of the non-linear time invariant system, when an input signal of the exponential sine sweep type is sent to it.

With reference to FIG. 10 that shows a spectrogram of an output signal of a non-linear time invariant system when an input signal of the exponential sine sweep type is sent therein, the distance $\Delta t_N$ between the right most line and the others (that are numbered from right to left), which remains unchanged also after the inverse convolution of the signal, represents the delay that the sine sweep signal uses to multiply n times its own instantaneous frequency f(t*). Starting from (6), we obtain:

$$\Delta t_N = (\ln N)\frac{T}{\ln\left(\frac{f_1}{f_0}\right)} \tag{10}$$

with $$N \ge 2$$

since:

$$f(t_* + \Delta t_N) = Nf(t_*)$$

$$f_0 e^{\frac{t_*+\Delta t_N}{T}\ln\left(\frac{f_1}{f_0}\right)} = Nf_0 e^{\frac{t_*}{T}\ln\left(\frac{f_1}{f_0}\right)}$$

$$e^{\frac{\Delta t_N}{T}\ln\left(\frac{f_1}{f_0}\right)} = N$$

$$e^{\frac{\Delta t_N}{T}\ln\left(\frac{f_1}{f_0}\right)} = e^{\ln N}$$

$$\frac{\Delta t_N}{T}\ln\left(\frac{f_1}{f_0}\right) = \ln N$$

Considering that $\Delta t_N$ is referred to the most right impulse, which is at t=T, from (10) we also obtain:

$$t_N = T - \Delta t_N = T\left(1 - \frac{\ln N}{\ln\left(\frac{f_1}{f_0}\right)}\right)$$

with $$N \ge 1$$

If the input signal x(t) of the linear time invariant system 1 is a signal ss(t) of the exponential sine sweep type [that is ss(ω(t)), in order to better underline that the frequency depends on the time] having the frequency which ranges from the starting value $f_0$ to a final frequency $f_1$ during T seconds, considering the (3) we will obtain:

$$\begin{cases} y(t) = h_0 + h_1(t)\otimes x(t) + h_2(t)\otimes x^2(t) + \dots + h_n(t)\otimes x^n(t) & \alpha\in\Re \\ x(t) = \alpha ss(\omega(t)) \end{cases}$$

and therefore:

$$y(t)=h_0+h_1(t)\otimes\alpha ss(\omega(t))+h_2(t)\otimes\alpha^2 ss^2(\omega(t))+\dots+h_n(t)\otimes\alpha^n ss^n(\omega(t)) \tag{11}$$

Where a is a multiplicative term that allows a signal of any amplitude to be handled in the mathematical formulation (the amplitude of ss(ω(t)) is in fact equal to 1).

(11) can be rewritten in the following way considering the trigonometric identities and considering the expansion limited to the 5th order:

$$\begin{aligned} y(t) \cong {} & h_0 + \alpha h_1(t)\otimes ss(\omega(t)) + \alpha^2 h_2(t)\otimes\left(\frac{1}{2} - \frac{1}{2}cs(2\omega(t))\right) + \\ & \alpha^3 h_3(t)\otimes\left(\frac{3}{4}ss(\omega(t)) - \frac{1}{4}ss(3\omega(t))\right) + \\ & \alpha^4 h_4(t)\otimes\left(\frac{3}{8} - \frac{1}{2}cs(2\omega(t)) + \frac{1}{8}cs(4\omega(t))\right) + \\ & \alpha^5 h_5(t)\otimes\left(\frac{5}{8}ss(\omega(t)) - \frac{5}{16}ss(3\omega(t)) + \frac{1}{16}ss(5\omega(t))\right) \end{aligned} \tag{12}$$

where cs(ω(t)) is a signal of the cosine sweep type, which is equivalent to a sine sweep signal with phase delay of $$\frac{\pi}{2}.$$

Collecting similar terms, we obtain:

$$\begin{aligned} y(t) \cong {} & \left(h_0 + \alpha^2 h_2(t)\otimes\frac{1}{2} + \alpha^4 h_4(t)\otimes\frac{3}{8}\right) + \\ & \left(\alpha h_1(t) + \frac{3}{4}\alpha^3 h_3(t) + \frac{5}{8}\alpha^5 h_5(t)\right)\otimes ss(\omega(t)) + \\ & \left(-\frac{1}{2}\alpha^2 h_2(t) - \frac{1}{2}\alpha^4 h_4(t)\right)\otimes cs(2\omega(t)) + \\ & \left(-\frac{1}{4}\alpha^3 h_3(t) - \frac{5}{16}\alpha^5 h_5(t)\right)\otimes ss(3\omega(t)) + \\ & \frac{1}{8}\alpha^4 h_4(t)\otimes cs(4\omega(t)) + \frac{1}{16}\alpha^5 h_5(t)\otimes ss(5\omega(t)) \end{aligned}$$

Convolving the output signal y(t) with the inverse of the signal ss(ω(t)), we obtain:

$$y(t)\otimes\overline{ss(\omega(t))}\cong A(t)\otimes\overline{ss(\omega(t))}+B(t)\otimes ss(\omega(t))\otimes\overline{ss(\omega(t))}+C(t)\otimes cs(2\omega(t))\otimes\overline{ss(\omega(t))}+D(t)\otimes ss(3\omega(t))\otimes\overline{ss(\omega(t))}+E(t)\otimes cs(4\omega(t))\otimes\overline{ss(\omega(t))}+F(t)\otimes ss(5\omega(t))\otimes\overline{ss(\omega(t))} \quad (13)$$

where:

$$\begin{cases} A(t)=h_0+\alpha^2h_2(t)\otimes\frac{1}{2}+\alpha^4h_4(t)\otimes\frac{3}{8} \\ B(t)=\alpha h_1(t)+\frac{3}{4}\alpha^3h_3(t)+\frac{5}{8}\alpha^5h_5(t) \\ C(t)=-\frac{1}{2}\alpha^2h_2(t)-\frac{1}{2}\alpha^4h_4(t) \\ D(t)=-\frac{1}{4}\alpha^3h_3(t)-\frac{5}{16}\alpha^5h_5(t) \\ E(t)=\frac{1}{8}\alpha^4h_4(t) \\ F(t)=\frac{1}{16}\alpha^5h_5(t) \end{cases} \quad (14)$$

A(t) is a constant term as well as the term A(t)*$\overline{ss(\omega(t))}$ that represents a DC offset, and can therefore be removed by using a filter of the high-pass type, since it is not relevant for the calculation of the kernels of Volterra series expansion. In order to obtain the kernels of the Volterra series expansion of the non-linear time invariant system 1, then the method provides for moving from time domain to frequency domain using the Fourier transforms. In particular, if X(ω) denotes the Fourier transform of ss(ω(t)), $\overline{X(\omega)}$ the Fourier transform of the inverse of ss(ω(t)), for which is valid $F^{-1}[X(\omega)\overline{X(\omega)}]=\delta(t-t_1)$ and considering that if F[g(ω(t))]=G(ω), then $$F[g(a\omega(t))]=\frac{G\left(\frac{\omega}{a}\right)}{|a|}$$

and that F[cs(ω(t))]=jF[ss(ω(t))]=jX(ω)

(considering only the positive part of the signal spectrum), then, calculating the Fourier transform of (13) and removing the DC offset, we obtain:

$$F[y(t)\otimes\overline{ss(\omega(t))}]\cong B(\omega)X(\omega)\overline{X(\omega)}+C(\omega)j\frac{X\left(\frac{\omega}{2}\right)}{|2|}\overline{X(\omega)}+D(\omega)\frac{X\left(\frac{\omega}{3}\right)}{|3|}\overline{X(\omega)}+E(\omega)j\frac{X\left(\frac{\omega}{4}\right)}{|4|}\overline{X(\omega)}+F(\omega)\frac{X\left(\frac{\omega}{5}\right)}{|5|}\overline{X(\omega)} \quad (15)$$

where B(ω) . . . F(ω) represent the Fourier transform of B(t) . . . F(t). Since, due to the proprieties of the signals of the sine sweep type, it is:

$$\begin{cases} F^{-1}[X(\omega)\overline{X(\omega)}]\cong\delta(t-\tau_1) \\ F^{-1}\left[\frac{X\left(\frac{\omega}{2}\right)}{|2|}\overline{X(\omega)}\right]\cong\delta(t-\tau_2) \\ F^{-1}\left[\frac{X\left(\frac{\omega}{3}\right)}{|3|}\overline{X(\omega)}\right]\cong\delta(t-\tau_3) \\ F^{-1}\left[\frac{X\left(\frac{\omega}{4}\right)}{|4|}\overline{X(\omega)}\right]\cong\delta(t-\tau_4) \\ F^{-1}\left[\frac{X\left(\frac{\omega}{5}\right)}{|5|}\overline{X(\omega)}\right]\cong\delta(t-\tau_5) \end{cases}$$

then, calculating the inverse Fourier transform of (15), we obtain the following equation:

$$deconv(t)\cong F^{-1}[B(\omega)]*\delta(t-\tau_1)+F^{-1}[jC(\omega)]*\delta(t-\tau_2)+F^{-1}[D(\omega)]*\delta(t-\tau_3)+F^{-1}[jE(\omega)]*\delta(t-\tau_4)+F^{-1}[F(\omega)]*\delta(t-\tau_5)$$

that can be rewritten in the following way:

$$deconv(t)\cong k_1(t-\tau_1)+k_2(t-\tau_2)+k_3(t-\tau_3)+k_4(t-\tau_4)+k_5(t-\tau_5) \quad (16)$$

Figure 9:
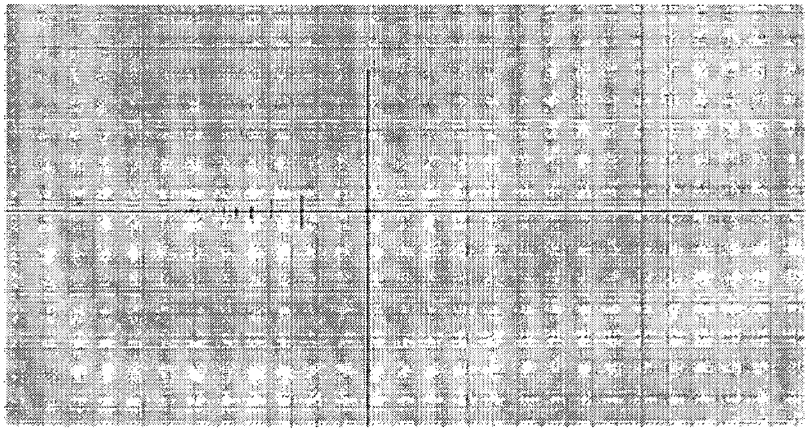
FIG. 9 is a diagram of the inverse convolution of a non-linear time invariant system subjected to an exponential sine sweep.

Each term in the expression (16) represents one of the vertical lines in FIG. 9.

Starting from (14), we obtain the following system:

$$\begin{cases} K_1(\omega)=B(\omega)=\alpha H_1(\omega)+\frac{3}{4}\alpha^3H_3(\omega)+\frac{5}{8}\alpha^5H_5(\omega) \\ K_2(\omega)=jC(\omega)=j\left(-\frac{1}{2}\alpha^2H_2(\omega)-\frac{1}{2}\alpha^4H_4(\omega)\right) \\ K_3(\omega)=D(\omega)=-\frac{1}{4}\alpha^3H_3(\omega)-\frac{5}{16}\alpha^5H_5(\omega) \\ K_4(\omega)=jE(\omega)=j\frac{1}{8}\alpha^4H_4(\omega) \\ K_5(\omega)=F(\omega)=\frac{1}{16}\alpha^5H_5(\omega) \end{cases}$$

where $K_i(\omega)$ represents the Fourier transform of $k_i(t)$, that is the Fourier transform of a harmonic response, after the response has been isolated i.e. after having removed its delay.

Such system can be rewritten as:

$$\begin{cases} H_1(\omega)=\frac{K_1(\omega)+3K_3(\omega)+5K_5(\omega)}{\alpha} \\ H_2(\omega)=\frac{2jK_2(\omega)+8jK_4(\omega)}{\alpha^2} \\ H_3(\omega)=\frac{-4K_3(\omega)-20K_5(\omega)}{\alpha^3} \\ H_4(\omega)=\frac{-8jK_4(\omega)}{\alpha^4} \\ H_5(\omega)=\frac{16K_5(\omega)}{\alpha^5} \end{cases}$$

In such a way, the $H_n(\omega)$ terms have been isolated, by calculating their inverse Fourier transforms we obtain the kernel values of the system km.

Once the kernel values $h_n(t)$ and the input signal x(t) are known, it is thus possible to determine the value of the output signal y(t) of the non-linear time invariant system 1 using (3).

In this manner it is possible to define the non-linear characteristics of the non-linear time invariant system 1. This allows the output signal of a non-linear system to be obtained, once the input signal is known, with excellent degree of approximation, and therefore it allows to artificially emulate the behavior of the non-linear time invariant system 1, for example by means of a data processing system. If the non-linear system 1 is a musical instrument, for example a particular specimen violin like a Stradivari or else, it is possible to obtain its characteristics by mechanically exciting the bridge of the violin with a stress having a sine sweep pattern, recording the produced sound and applying the aforementioned calculation method.

After having obtained the kernels that characterize the non-linear time invariant system defined by that particular specimen of violin, it is possible to artificially reproduce any sound signal in the same way as it would be played by that particular specimen of violin, simply recording the input signal of another musical instrument of the same type. For example, in the case of violins, it is possible to record the stresses caused in the bridge of any violin when a music piece is played, and to apply the characteristics of the particular specimen of violin aforementioned to the signal so recorded to obtain as a result the music piece with the same "sound color" as it would be obtained with that particular specimen of violin.

In general, regardless of the non-linear system, once the kernels characterizing the system have been obtained, it is possible to emulate operation of the system by applying to any input signal x'(t) the Volterra diagonal series expansion to obtain the output signal y'(t) that would be obtained by the system in question.

However, it should be noted that even though the sine sweep theoretically follows the proprieties reported further on and already utilized in the theoretical formulation of the method, it is necessary to realize that these postulates could not practically be exactly confirmed.

As far as the sine sweep properties are concerned, we wrote:

$$\begin{cases} F^{-1}[X(\omega)\overline{X(\omega)}] \cong \delta(t-\tau_1) \\ F^{-1}\left[\dfrac{X\left(\frac{\omega}{2}\right)}{|2|}\overline{X(\omega)}\right] \cong \delta(t-\tau_2) \\ F^{-1}\left[\dfrac{X\left(\frac{\omega}{3}\right)}{|3|}\overline{X(\omega)}\right] \cong \delta(t-\tau_3) \\ F^{-1}\left[\dfrac{X\left(\frac{\omega}{4}\right)}{|4|}\overline{X(\omega)}\right] \cong \delta(t-\tau_4) \\ F^{-1}\left[\dfrac{X\left(\frac{\omega}{5}\right)}{|5|}\overline{X(\omega)}\right] \cong \delta(t-\tau_5) \end{cases} \quad (17)$$

Figure 11:
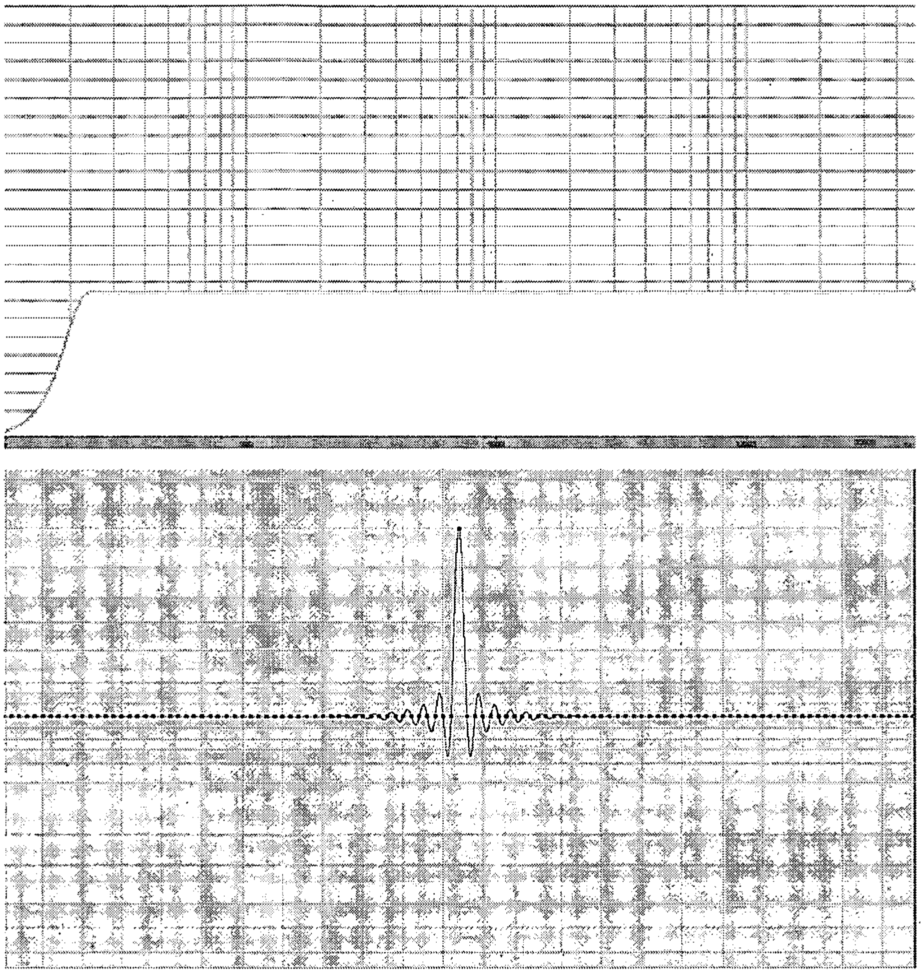
FIG. 11 shows the amplitude diagram of the frequency response of a signal of the Dirac Delta type and its waveform.

The first equation in (17) states that by convolving a sine sweep, e.g. of 15 seconds from 20 Hz to 48 kHz, with its inverse, it results into a waveform of the Dirac Delta type. This result is always verified as shown in FIG. 11. The amplitude diagram of the frequency response shows a flat spectrum and also the waveform has a shape which can be compared to a Dirac Delta.

The second equation in (17) states that by convolving the aforementioned inverse sine sweep with a sine sweep of 15 seconds between 40 Hz and 96 kHz should equally obtain the Dirac Delta. FIG. 12 shows how this expectation in this case failed to meet (the problem is not caused by aliasing limitation, since all the examples follow the Shannon theorem). Even if the amplitude diagram of the frequency response is flat, the shape of the waveform differs significantly from a Dirac Delta shape. This mismatch is due only to a phase distortion of the harmonic components of the signal, since the amplitude diagram of the frequency response is correct, i.e. it is flat.

Figure 13:
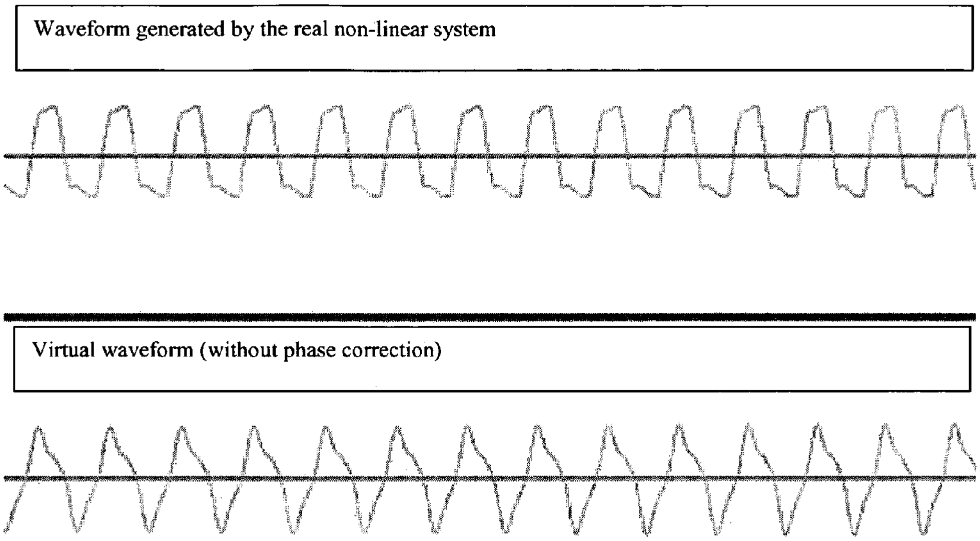
FIG. 13 shows the result of an emulation of a non-linear time invariant system without considering the phase problems.

This problem arises in practice every time someone relies on equations (17). The phase distortion provokes a wrong emulation of the non-linear system, FIG. 13.

The planned solution for solving these problems consists, in this case, in designing 4 FIR filters which, once they have been applied to the Dirac Deltas with the aforementioned problems (derived from the second, third, fourth and fifth equations in (17), respectively), are able to "re-align" the phase, bringing back the signal to shapes of the type as shown in FIG. 11.

Figure 14:
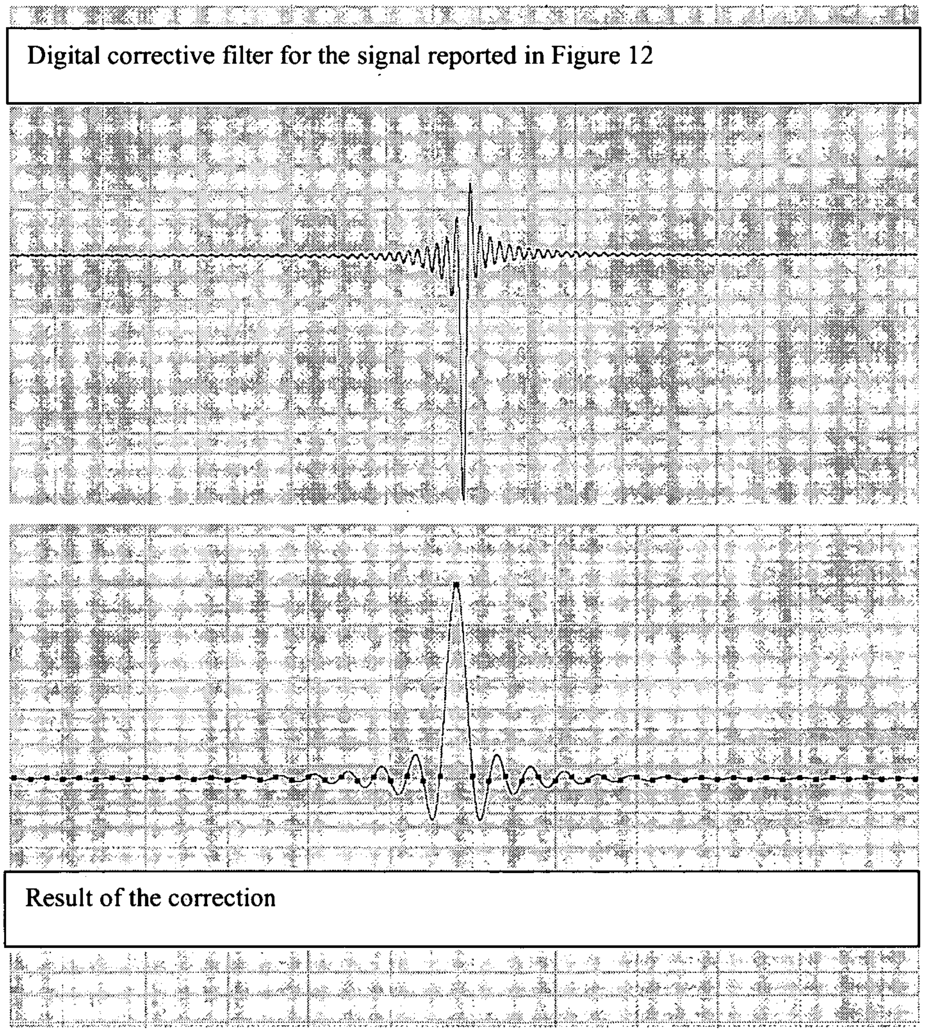
FIG. 14 shows the impulse response of a FIR filter that is able to correct the phase problems once it is applied to the signal in FIG. 12.
Figure 15:
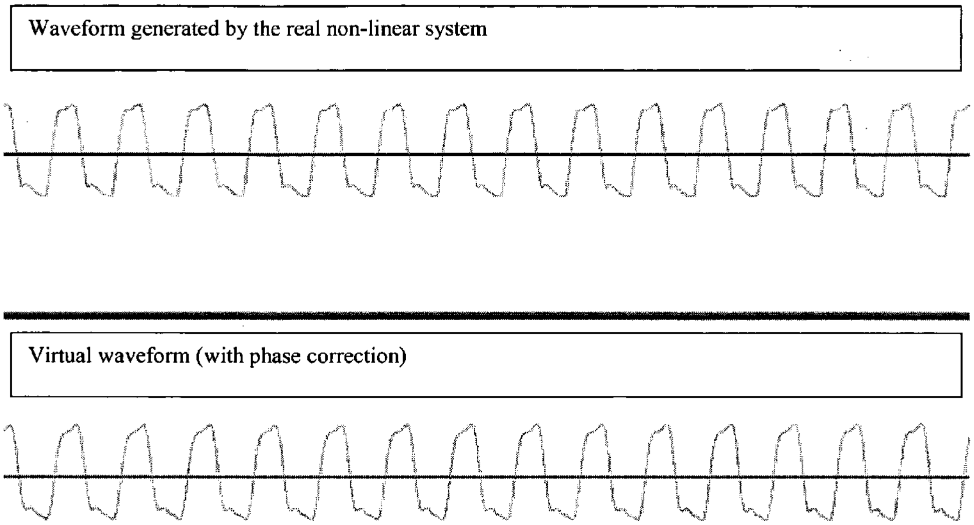
FIG. 15 and FIG. 16 shows the achieved results once the phase problems have been corrected.
Figure 16:
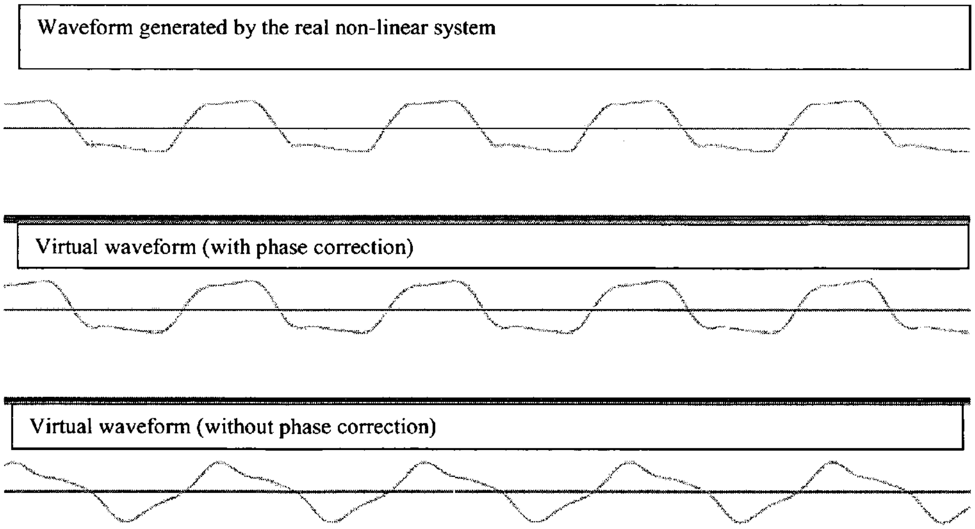

The method used for calculating these filters follows the method proposed by Nelson-Kirkeby. FIG. 14 shows first the impulse response of the FIR filter designed for correcting the phase problems of the signal shown in FIG. 12, and then the Dirac Delta obtained after the phase correction. Once the four corrective filters have been calculated and applied to the corresponding harmonic responses in equation (16), that is in FIG. 9, it is at last possible to correctly emulate the non-linear system, as shown in FIG. 15. FIG. 16 shows a comparison between the emulation method obtained without the phase correction and with the correction here proposed.

Moreover, it should be noted that, as already explained, in the mathematical treatment a coefficient is applied to the sine sweep, this coefficient describing the amplitude thereof: the coefficient a.

This coefficient highlights that each kernel depends on the amplitude of the test signal. This type of knowledge is fundamental in the study of non-linear systems, since different harmonics are stimulated according to the amplitude of the stimulus represented by the input test signal.

In order to a correct knowledge of such parameter, before measuring the non-linear system, it is necessary to calibrate the measuring chain in such a way that a given output sine sweep amplitude value matches with the same input sine sweep value. This can be obtained for example by connecting in loopback (output connected to input) the acquiring device.

After having calibrated the equipment, it is possible to measure the non-linear system at any amplitude.

Usually having to do with audio signals the signal amplitude is expressed using dBFS, therefore it will be necessary to convert such value to obtain a value by means of the following formula:

$$\alpha = 10^{\left(\frac{amplitude\_in\_dB}{20}\right)}$$

The invention claimed is:

1. A method for artificially reproducing an output acoustic signal of a non-linear time invariant system using a data processing device, comprising the steps of:

inserting an input acoustic signal of exponential sine sweep type into said non-linear time invariant system;

acquiring an output acoustic signal of said non-linear time invariant system corresponding to said input acoustic signal;

obtaining a mathematical function that characterizes said non-linear time invariant system on the basis of said output acoustic signal, said mathematical function being calculated assuming that said output acoustic signal is obtained by means of a Volterra series expansion of said input acoustic signal;

applying said mathematical function to a further acoustic signal to obtain a still further acoustic signal that reproduces the output acoustic signal that would be obtained from said non-linear time invariant system if it were driven by said further acoustic signal;

executing a convolution of said output acoustic signal, expressed as a Volterra series expansion of said input acoustic signal, with the inverse of said input acoustic signal;

calculating the Fourier transform of said convolution; and executing the inverse convolution of said Fourier transform and applying corrective FIR filters to each term of said inverse convolution, said FIR filters being calculated by means of the Nelson-Kirkeby method.

2. A method according to claim 1, wherein said further acoustic signal is an input acoustic signal detected in a further non-linear time invariant system of the same type of said non-linear time invariant system.

3. A method according to claim 1, and further comprising the step of calculating the kernels of said Volterra series expansion using said convolution.

4. A method according to claim 3, and further comprising the step of determining said mathematical function of said non-linear time invariant system using said kernels.

5. A method according to claim 1 or 2, wherein an acquiring device is used for said acquiring step and an output of said acquiring device is connected in a feedback loop with an input of said acquiring device.

6. A method according to claim 1 or 2, wherein said non-linear time invariant system is a musical instrument.

* * * * *